United States Patent [19]

Ham

[11] 3,942,120
[45] Mar. 2, 1976

[54] SWD FM RECEIVER CIRCUIT
[75] Inventor: Ronald E. Ham, Garland, Tex.
[73] Assignee: Texas Instruments Incorporated, Dallas, Tex.
[22] Filed: July 22, 1974
[21] Appl. No.: 490,475

[52] U.S. Cl. ............... 325/344; 325/388; 325/437; 325/451
[51] Int. Cl.² .......................................... H04B 1/26
[58] Field of Search .......... 325/318, 344, 346, 388, 325/418, 434, 437, 442, 451, 472, 473, 488, 489, 461; 333/95 S

[56] References Cited
UNITED STATES PATENTS

| | | | |
|---|---|---|---|
| 3,372,337 | 3/1968 | Beres | 325/437 |
| 3,525,046 | 8/1970 | Bourget | 325/437 |
| 3,541,451 | 11/1970 | Lind | 325/344 |
| 3,575,660 | 4/1971 | Jorgensen | 325/388 |
| 3,581,211 | 5/1971 | Maitland et al. | 325/451 |
| 3,626,300 | 12/1971 | Kennedy | 325/489 |
| 3,639,840 | 2/1972 | Shekel et al. | 325/461 |
| 3,663,747 | 5/1972 | Janssen | 325/488 |
| 3,787,612 | 1/1974 | DeVries et al. | 325/489 |
| 3,863,136 | 1/1975 | Hanson | 325/451 |

Primary Examiner—Albert J. Mayer
Assistant Examiner—Jin F. Ng
Attorney, Agent, or Firm—Harold Levine; James T. Comfort; James O. Dixon

[57] ABSTRACT

An FM tuner for feeding an IF section of a receiver circuit includes an antenna signal input circuit with broad band response to signals in a selected FM broadcast band. A mixer is connected to receive the signal from the input circuit and a variable local oscillator is connected to the mixer operating for high side injection to produce an IF signal centered within an RF band of minimal signal content and to produce an image displaced outside the response of the input circuit. An SWD filter connected to the output of the mixer has narrow band response at the IF frequency.

4 Claims, 3 Drawing Figures

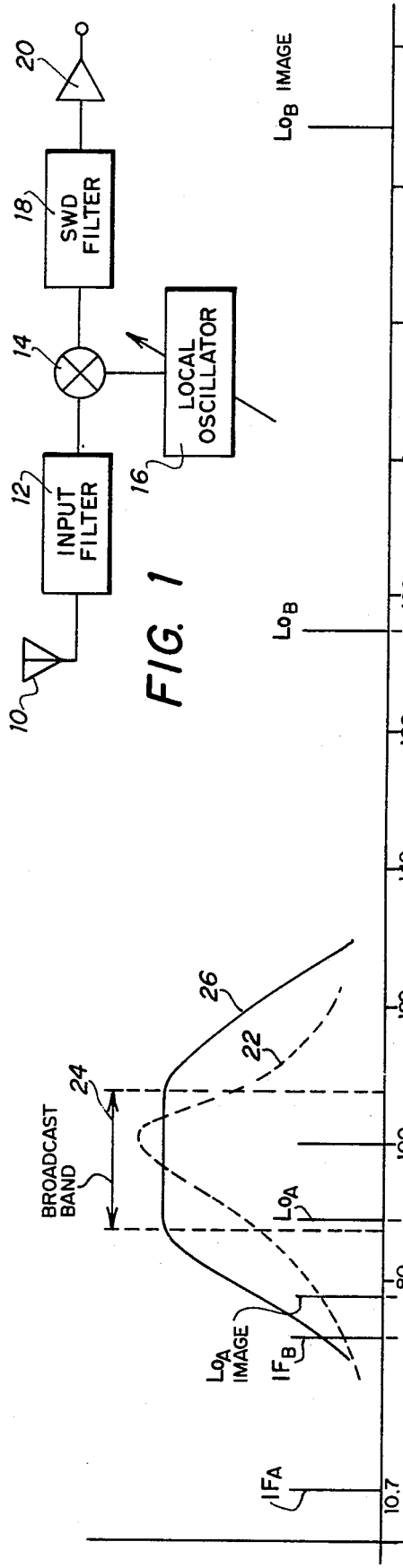
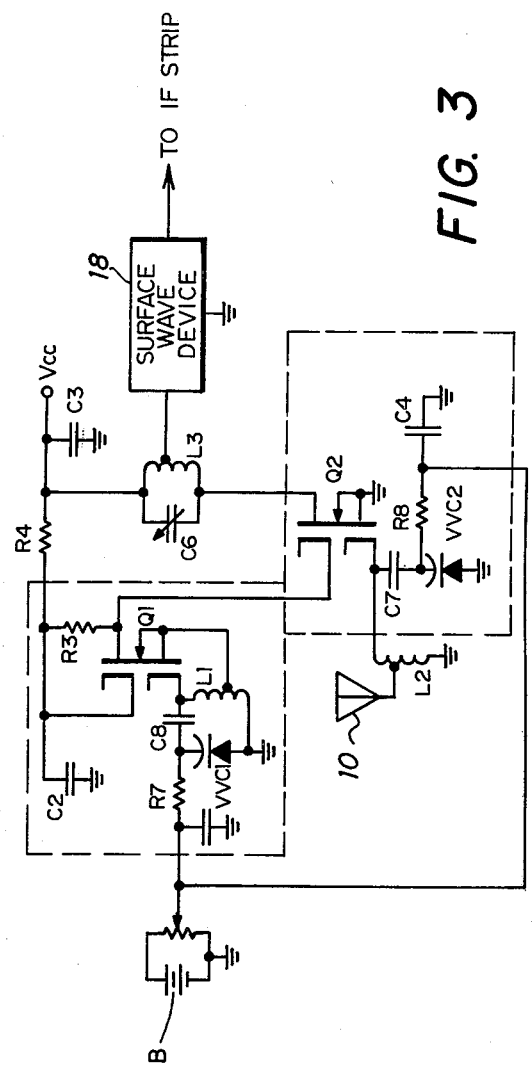

SWD FM RECEIVER CIRCUIT

This invention relates to an FM tuner, and more particularly to a high fidelity FM tuner that may be executed extensively in integrated circuit form.

Broadcast or entertainment FM receivers of high quality generally are very expensive because of the necessity for narrow frequency selectivity. Such filtering with minimum phase distortion generally involves complex filter circuits with the result that FM systems free of phase distortion are costly.

Heretofore FM receivers with minimized phase distortion have utilized multisection high loss filters connected in tandem. This requires signal amplification in order to compensate for the loss and thus raises the noise level. The present invention provides a good signal-to-noise factor while minimizing phase distortion through the use of an IF filter comprising a surface wave device (SWD) operated at frequencies which minimize passage of unwanted signals and noise.

In prior art VHF receivers, especially FM receivers, the systems generally include a first mixer which is preceded by multisection filters and narrow band preselection filter designed to track a local oscillator to produce an IF frequency of, for example, 10.7 mHz. The use of such a low IF frequency requires the IF filtering following the mixer to be performed with inductor-capacitor resonators or bulk mode resonators. This causes band shaping to become difficult and extremely expensive if phase linearity is to be achieved.

The present invention is directed toward minimizing the foregoing problems through the use of nontracking broad band preselection and through the use of surface wave device (SWD) IF filters to provide linear phase response with minimum package size and little or no manual adjustment.

More particularly in accordance with the present invention, there is provided an FM tuner having a broad band input signal filter to cover with substantially uniform response a given entertainment FM broadcast band. A local oscillator feeds a mixer also fed by the output of the input signal filter to produce an IF signal substantially free from broadcast energy with the local oscillator providing high side injection to place image signals substantially outside the response band of the input signal filter. An SWD filter is connected as to apply the signal output from the mixer to an IF strip and to establish pass band response centered at said IF frequency.

In a more specific aspect, an FM tuner is provided for feeding an IF section of a receiver circuit in which an antenna signal input circuit is provided with broad band input response for signals in a selected FM broadcast band. A mixer is connected to receive the signals from the input filter along with the output from a variable local oscillator which is connected to the mixer operating to provide high side injection to produce an IF signal centered within an RF band of minimum signal content and producing an image outside the response of the input filter. An SWD filter is then provided having a narrow pass band at the IF frequency.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

FIG. 1 illustrates in block diagram form an embodiment of the invention;

FIG. 2 illustrates operation of filters embodied in the invention; and

FIG. 3 illustrates a circuit diagram of an embodiment of the invention.

Referring now to FIG. 1, a VHF tuner is illustrated wherein the antenna 10 is connected by way of an input filter 12 to a mixer 14. The second input of the mixer 14 is supplied from a local oscillator 16. The output of the mixer is then applied to a surface wave device filter 18 whose output is connected to an IF strip generally indicated by amplifier 20. This superheterodyne arrangement differs from prior systems in that only the local oscillator 16 needs to be varied. Input filter 12 may be broad band to cover the particular broadcast band of interest without necessity for variable tuning. The input filter 12 may be variable. In any event, there is absent the necessity for close tracking conventionally required between oscillator 16 and the input filter 12 to achieve narrow band preselection over a wide broadcast band.

System operation as compared with prior systems can be illustrated by reference to FIG. 2 wherein a selected broadcast band, such as the FM band 24, occupies that portion of the spectrum lying between 88 and 108 mHz. Normally, prior art systems employ an IF frequency corresponding to the $IF_A$ frequency at 10.7 mHz. In such case with low side injection of the local oscillator frequency at 89.3 mHz, the $IF_A$ frequency is established for detection of a signal at 100 mHz. Normally, a fairly sharp filter which is represented by the dotted outline 22 is utilized and the peak frequency is varied simultaneously with variations in the frequency in the local oscillator to tune in different frequencies within band 24. The use of the local oscillator frequency of 89.3 mHz results in an image band at 78.6 mHz. Normally, this is not sufficiently rejectable by the filter having the pass band 22. Feed through of unwanted components represented by the $LO_A$ image frequency at 78.6 mHz cannot be readily avoided.

In accordance with the present invention, local oscillator 16 is selected for high side injection using an IF frequency $IF_B$ which leads to the use of a SWD filter 18 of size compatible with inexpensive packaging while having a controllable characteristic. It is necessary that for minimum phase distortion filter 18 have a gaussian attenuation characteristic to provide a linear phase characteristic thereby minimizing phase distortion. Furthermore, the $IF_B$ frequency at 73.5 mHz is in the center of a radio-astronomy listening band of 73 to 74.6 mHz, thus assuring the absence in the IF of feed through interference. A broad band front end filter can be used if the mixer 14 is designed for high signal levels, i.e., minimum intermodulation distortion inferring maximum intercept point. This eliminates the preselect oscillator tracking problems and avoids excessive front end gain which heretofore has been required to compensate for loss in narrow band tracking filters. By the use of a local oscillator at 173.5 mHz for detection of a signal at 100 mHz, the $LO_B$ image is at 247 mHz, well beyond the response range of the broad band response characteristic 26 of filter 12.

Referring now to the circuit of FIG. 3, an oscillator circuit and a mixer circuit are illustrated for supplying an IF signal to a SWD filter whose output is applied to an IF section of a receiver system.

In the mixer circuit a VHF input signal such as derived from antenna 10 is applied to a low impedance tap on an inductor L2. The output signal if then applied to the first gate of a dual gate field effect transistor (DGFET) Q2. The inductor L2 is effectively tuned by capacitors C7 and voltage variable capacitor VVC2. Capacitors C7 and VVC2 are connected in series to ground to parallel inductor L2. The magnitude of capacitor VVC2 is controlled by a voltage applied through resistor R8. Capacitor C4 is provided to bypass any A.C. components to ground The source terminal of Q2 is connected to ground and to the Q2 substrate. The drain terminal of Q2 is connected through inductor L3 to the source $V_{CC}$. Inductor L3 is connected in parallel with a capacitor C6. The low impedance tap on inductor L3 is connected to an SWD filter 18 whose output is then connected to an IF amplifier strip.

A variable voltage from battery B applied through resistor R8 serves to vary the frequency to which the input circuit is tuned.

In the oscillator circuit, a D.C. voltage from battery B is applied through resistor R7 to a variable tuned circuit. The oscillator is controlled in frequency by the LC circuit comprising inductor L1, capacitor C8 and the variable capacitor VVC1. Resistor R7 is connected to the terminal common to capacitors VVC1 and C8. The junction between inductor L1 and capacitor C8 is connected to the first gate of the DGFET Q1. The source terminal of C is supported to a low impedance tap on inductor L1 and to the Q1 substrate. The drain terminal of Q1 is connected to the second gate of Q2 and by way of resistor R3 to the second gate of Q1. The second gate of Q1 is also connected through capacitor C2 to ground and to the supply $V_{CC}$ by way of resistor R4. Capacitors C2 and C3 and resistor R4 perform bypass functions for the $V_{CC}$ voltage.

In practice, the control voltage applied to the mixer through resistor R8 and to the oscillator through resistor R7 may be from the same source. Depending upon the construction of the voltage variable capacitors, they may be of the same magnitude or may be displaced one from another.

In an FM receiver it is necessary to use an IF filter which has a band pass of about 300 kHz. The FM broadcast band extends over a range of 20 mHz. SWD 18 acting as a filter may be provided at a minimal cost with a pass band of the order of 300 kHz. Because of the band pass characteristics of the SWD, it is possible to select the IF frequency such that the wide band filter may be employed on the front end of an FM receiver utilizing a SWD for an IF filter thereby permitting a simplified front end that may be constructed in integrated circuit form.

In the circuit of FIG. 3, for example, the oscillator components and mixer components may all be integrated on a single substrate except for inductors L1, L2 and L3. Fabrication techniques may allow excluding capacitor C6, resistor R4 and capacitor C3 from the circuit. The circuit thus meets a criterion of low cost elements desired for the consumer market while providing an FM receiver of high performance, particularly for entertainment type of reception. Over the range of from 88 to 108 megacycles of broadcast signals, the related IF pass band is maintained at about 300 kHz wide. The system satisfies the requirement that any FM IF system needs linear phase characteristics in order to minimize phase distortion of the signal. At 10.7 mHz, the IF problem is very difficult to solve. In accordance with the present invention, it is readily solved through the use of SWD 18 at 73.5 mHz.

An SWD could be constructed to operate at 10.7 mHz, but in such case it is very large and does not lend itself to the achievement of the objectives set out. With the IF set at 73.5 mHz or at some frequency within the range of from 60 to 80 mHz, the SWD size is reduced, typically to about 1 inch in length, ⅜ inch wide and 0.030 inch thick. The local oscillator may operate at frequencies in the range of from 161.5 to 181.5 mHz to tune the broadcast band with high side injection. The image is then greatly displaced from the band of interest, i.e., in the band of from 235 to 255 mHz. Use of 10.7 mHz IF with high side injection, the local oscillator would range from 98.7 to 118.7 mHz with the image in the band from 109.4 to 121.4 which would not be readily eliminated. In contrast, the 235–255 mHz image range can readily be eliminated. This permits the use of a broad band front end filter with SWD 18 as the IF filter. The front end tuner comprising the present invention can be executed in large part in integrated circuit form, selecting operating frequencies such that feed through of unwanted signals is minimized.

In FIG. 3, there is noted that the input filter comprising inductor L2, capacitors C7 and VV is variable through the use of the tuning voltage applied through resistor R8. Preferably the present invention involves a fixed broad band input filter having character 26 of FIG. 2.

Having described the invention in connection with certain specific embodiments thereof, it is to be understood that further modifications may now suggest themselves to those skilled in the art, and it is intended to cover such modifications as fall within the scope of the appended claims.

What is claimed is:

1. An FM tuner for feeding an IF section of a receiver circuit which comprises:
   a. an antenna signal input circuit including a broad band pass input filter having an essentially flat response to signals in the 88 to 108 mHz FM broadcast band,
   b. a mixer connected to receive the signal from said input circuit,
   c. a variable local oscillator connected to said mixer operating for high side injection to produce an IF signal centered within the radio astronomy listening band of 73 to 74.6 mHz and an image frequency displaced outside the response of said input filter, and
   d. an SWD filter connected to the output of said mixer having a narrow pass band of 300 kHz centered at the frequency of said IF signal, the output of said SWD filter being the IF output of said tuner.

2. The combination set forth in claim 1 in which said oscillator and said mixer exclusive of their inductance components are executed in integrated circuit form on a common substrate.

3. The combination set forth in claim 1 in which said IF signal is about 73.5 mHz.

4. An FM tuner which comprises:
   a. a first dual gate MOSFET,
   b. a voltage tuned oscillator circuit connected at its output to the second gate of said MOSFET, the oscillation frequency of said oscillator being variable over a range of from about 161.5 to 181.5 mHz, c. an antenna input signal circuit connected to a first gate of said MOSFET by way of a voltage tuned resonant circuit responsive to pass signals within the frequency range of from 88 to 108 mHz and to reject signals of the frequency of said oscillator and higher frequencies, and d. a SWD filter connected to receive signals from said MOSFET having a narrow band pass of about 300 kHz centered at about 73.5 mHz.

* * * * *